United States Patent
Han (10) Patent No.: US 8,542,225 B2
(45) Date of Patent: Sep. 24, 2013

(54) EMISSION CONTROL LINE DRIVERS, ORGANIC LIGHT EMITTING DISPLAY DEVICES USING THE SAME AND METHODS OF CONTROLLING A WIDTH OF AN EMISSION CONTROL SIGNAL

(75) Inventor: Sam-Il Han, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 611 days.

(21) Appl. No.: 12/805,883

(22) Filed: Aug. 23, 2010

(65) Prior Publication Data

US 2011/0102398 A1    May 5, 2011

(30) Foreign Application Priority Data

Nov. 4, 2009    (KR) .................. 10-2009-0105984

(51) Int. Cl.
*G06F 3/038*    (2006.01)
*G09G 5/00*    (2006.01)

(52) U.S. Cl.
USPC .............. 345/209; 377/64; 377/81; 345/76; 345/211; 345/46; 345/691; 345/208

(58) Field of Classification Search
USPC ........................... 345/209; 377/64
See application file for complete search history.

(56) References Cited

U.S. PATENT DOCUMENTS

| | | | |
|---|---|---|---|
| 2004/0032926 A1* | 2/2004 | Yu | 377/64 |
| 2005/0008114 A1* | 1/2005 | Moon | 377/64 |
| 2005/0206637 A1* | 9/2005 | Takahashi et al. | 345/204 |
| 2007/0040786 A1 | 2/2007 | Chung | |
| 2007/0046608 A1 | 3/2007 | Chung | |
| 2007/0063833 A1* | 3/2007 | Kates | 340/521 |
| 2007/0063933 A1 | 3/2007 | Chung | |
| 2008/0157684 A1* | 7/2008 | Chung | 315/169.3 |
| 2008/0165095 A1* | 7/2008 | Jeon et al. | 345/76 |
| 2008/0218502 A1* | 9/2008 | Lee et al. | 345/208 |
| 2009/0256794 A1* | 10/2009 | Jang et al. | 345/100 |
| 2010/0207968 A1* | 8/2010 | Kim | 345/691 |

FOREIGN PATENT DOCUMENTS

| | | |
|---|---|---|
| JP | 2004-007175 A | 1/2004 |
| JP | 2007-323083 A | 12/2007 |
| KR | 10-0646992 B1 | 11/2006 |
| KR | 10-0666637 B1 | 1/2007 |
| KR | 10-0685833 B1 | 2/2007 |

OTHER PUBLICATIONS

Korean Office Action in KR 10-2009-0105984, dated Dec. 13, 2011 (Han).

* cited by examiner

*Primary Examiner* — Kent Chang
*Assistant Examiner* — Benjamin Morales Fernandez
(74) *Attorney, Agent, or Firm* — Lee & Morse, P.C.

(57) ABSTRACT

An emission control line driver includes even-numbered stages that are connected to even-numbered emission control lines, respectively, and are driven by a first clock signal, and odd-numbered stages that are connected to odd-numbered emission control lines, respectively, and are driven by a second clock signal, wherein each of the stages includes an input unit adapted to receive a control signal and an inverted control signal output from a previous one of the even and odd numbered stages or from an external source, the input unit being adapted to control voltages of a first node and a second node, a first output unit adapted to generate an emission control signal based on the voltages of the first node and the second node, and a second output unit adapted to generate an inverted emission control signal based on the voltages of the first node and the second node.

19 Claims, 10 Drawing Sheets

EMISSION CONTROL LINE DRIVERS, ORGANIC LIGHT EMITTING DISPLAY DEVICES USING THE SAME AND METHODS OF CONTROLLING A WIDTH OF AN EMISSION CONTROL SIGNAL

BACKGROUND

1. Field

Embodiments relate to emission control line drivers, organic light emitting display devices using an emission control line driver, and methods of controlling luminance of an organic light emitting display device. More particularly, embodiments relate to an emission control line driver, an organic light emitting display device using an emission control line driver, and methods of controlling luminance of an organic light emitting display device that are adapted to arbitrarily adjust a width of an emission control signal.

2. Description of the Related Art

In recent years, various flat panel display devices that are lighter in weight, smaller in volume than cathode ray tubes have been developed. Such flat panel display devices include, e.g., liquid crystal display devices, field emission display devices, plasma display panels, organic light emitting display devices, etc.

Among the flat panel display devices, an organic light emitting device may display an image using organic light emitting diodes that emit light by recombining holes with electrons. Such organic light emitting display devices may generally be advantageous as they may be driven with relatively less power while having a relatively rapid response speed. More particularly, organic light emitting display devices may employ a transistor for each pixel, and the transistor may be employed to supply a current corresponding to a data signal to the respective organic light emitting diode to generate light.

Such organic light emitting display devices may include a data driver for supplying the respective data signal to data lines, a scan driver for sequentially supplying a respective scan signal to scan lines, an emission control line driver for supplying a respective emission control signal to emission control lines, and a pixel unit including a plurality of pixels that are connected with the data lines, the scan lines, and the emission control lines.

The pixels included in the pixel unit may be selected when the scan signal is supplied to the scan lines and may receive the respective data signal from the data lines. The pixels receiving the data signals, respectively, may display a predetermined image while generating light having a predetermined luminance corresponding to the respective data signal. Emission time of each of the pixels is controlled by the emission control signal supplied from the emission control line. In general, while the emission control signal is supplied to be superimposed on the scan signal supplied from one scan line or two scan lines, the emission control signal sets pixels receiving the data signal to a non-emission state.

Currently, research for optimally setting luminance of a panel to correspond to external light intensity is being conducted. For example, it may be possible to control the luminance of the panel by adjusting a number of bits of data based on the external light intensity. Simpler and/or improved methods and/or devices for controlling a luminance of a panel based on external light intensity are desired.

SUMMARY

Embodiments are therefore directed to emission control line drivers, organic light emitting display devices using such an emission control line driver, and methods of controlling a width of an emission control signal, which substantially overcome one or more of the problems due to the limitations and disadvantages of the related art.

It is therefore a feature of an embodiment to provide an emission control line driver capable of simply and/or arbitrarily controlling a width of a supply time of emission control signals.

It is therefore a separate feature of an embodiment to provide an organic light emitting display employing an emission control line driver capable of simply controlling a pulse width of emission control signals.

It is therefore a separate feature of an embodiment to provide an emission control line driver capable of arbitrarily adjusting a pulse width of emission control signals.

It is therefore a separate feature of an embodiment to provide an organic light emitting display employing an emission control line driver capable of arbitrarily adjusting a pulse width of emission control signals.

It is therefore a separate feature of an embodiment to provide a method of controlling a luminance of a panel by adjusting a width of the emission control signal.

It is therefore a separate feature of an embodiment to provide an emission control driver adapted to control a turn-on time of pixels based on a width of the respective emission control signal so as to control luminance of a panel by adjusting the width of the emission control signal.

At least one of the above and other features and advantages may be realized by providing an emission control line driver, including even-numbered stages that are connected to even-numbered emission control lines, respectively, and are driven by a first clock signal, and odd-numbered stages that are connected to odd-numbered emission control lines, respectively, and are driven by a second clock signal, wherein each of the stages includes, an input unit adapted to receive a control signal and an inverted control signal output from a previous one of the even and odd numbered stages or from an external source, the input unit being adapted to control voltages of a first node and a second node, a first output unit adapted to generate an emission control signal based on the voltages of the first node and the second node, and a second output unit adapted to generate an inverted emission control signal based on the voltages of the first node and the second node.

The control signal may be one of an emission control signal output from the previous one of the stages and an externally supplied start signal, and the inverted control signal is one of an inverted emission control signal output from the previous one of the stages and an externally supplied inverted start signal.

The emission control line driver may include a dummy stage adapted to receive one of the first signal and the second clock signal and the start signal and the inverted start signal and to generate the emission control signal and the inverted emission control signal.

One cycle of the first clock signal and the second clock signal may correspond to two horizontal periods, and the first clock signal and the second clock signal may be inverse in phase relative to each other.

A width of the generated emission control signal may correspond to a number of horizontal periods during which the start pulse is supplied, and a width of the generated emission inverted emission control signal may correspond to a number of horizontal periods during which the inverted start pulse is supplied.

The start signal may be supplied when the start signal is set to a low level voltage, and the inverted start signal may be supplied when the inverted start signal is set to a high level voltage.

The input unit may include a driver adapted to control the voltages of the first node and the second node, a first transistor connected between the driver and a third input terminal, a gate electrode of the first transistor being connected to a second input terminal receiving the first clock signal or the second clock signal, and a second transistor connected between the driver and a first input terminal, a gate electrode of the second transistor being connected with the second input terminal.

The first input terminal may receive one of the control signal and the inverted control signal, and the third input terminal may receive the other of the control signal and the inverted control signal.

The first input terminal receives the control signal and the second input terminal may receive the inverted control signal.

The control signal one of an inverted emission control signal from the previous stage or a start signal and the inverted control signal may be an emission control signal from the previous stage or an inverted start signal.

The driver may include a third transistor and a fourth transistor connected in series between a first power source and a second power source that is lower than the first power source, a common node of the third and the fourth transistors being connected with the second node, and a fifth transistor and a sixth transistor connected in series between the first power and the second power, a common node of the fifth and the sixth transistors being connected with the first node.

The first output unit may include a seventh transistor connected between a first power source and a first output terminal, a gate electrode of the seventh transistor being connected to the first node, an eighth transistor connected between a second power source that is lower than the first power and the first output terminal, a gate electrode of the eighth transistor being connected with the second node, a first capacitor connected between a gate electrode and the gate electrode of the seventh transistor, and a second capacitor connected between a first electrode and the gate electrode of the eighth transistor.

The second output unit may include a ninth transistor and a tenth transistor connected in series between a first power source and a second power source that is lower than the first power source, a common node of the ninth and the tenth transistors being connected with a fourth node, an eleventh transistor and a twelfth transistor connected in series between the first power source and the second power source, a common node of the eleventh and the twelfth transistors being connected with a third node, a thirteenth transistor connected between the first power and the second output terminal, a gate electrode of the thirteenth transistor being connected to the third node, a fourteenth transistor connected between the second power source and the second output terminal, a gate electrode of the fourteenth transistor being connected to the fourth node, a third capacitor connected between a first electrode and the gate electrode of the thirteenth transistor, and a fourth transistor connected between a first electrode and the gate electrode of the fourteenth transistor, wherein gate electrodes of the ninth transistor and the twelfth transistor are connected to the second node and gate electrodes of the tenth transistor and the eleventh transistor are connected to the first node.

A first one of the stages may be driven by receiving the start signal and the inverted start signal as the control signal and the inverted control signal, respectively, and remaining ones of the stages may be driven by receiving the emission control signal and the inverted emission control signal of a respective one of the previous stages as the inverted control signal and the control signal, respectively.

A width of the emission control signal and a width of the inverted emission control signal generated by each of the stages may correspond to a number of horizontal periods during which the control signal is supplied thereto.

At least one of the above and other features and advantages may be separately realized by providing an organic light emitting display device, including a scan driver adapted to sequentially supply a scan signal to scan lines, a data driver adapted to supply a respective data signal to data lines, an emission control line driver adapted to supply a respective emission control signal to emission control lines, and pixels positioned at intersection portions of the scan lines, the emission control lines, and the data lines, the emission control line driver, including even-numbered stages that may be connected to even-numbered emission control lines, respectively, and may driven by a first clock signal, and odd-numbered stages that are connected to odd-numbered emission control lines, respectively, and may be driven by a second clock signal, wherein each of the stages may include an input unit adapted to receive a control signal and an inverted control signal output from a previous one of the even and odd numbered stages or from an external source, the input unit being adapted to control voltages of a first node and a second node, a first output unit adapted to generate an emission control signal based on the voltages of the first node and the second node, and a second output unit adapted to generate an inverted emission control signal based on the voltages of the first node and the second node.

At least one of the above and other features and advantages may be separately realized by providing a method for adjusting a width of an emission control signal, including supplying a first clock signal to even-numbered stages of an emission control line driver, the even-numbered stages being connected to even-numbered emission control lines of a panel, respectively, supplying a second clock signal to odd-numbered stages of the emission control line driver, the odd-numbered stages being connected to odd-numbered emission control lines, respectively, wherein each of the even and the odd numbered stages includes an input unit, a first output unit and a second output unit, and driving each of the even and odd numbered stages includes supplying a control signal and an inverted control signal output from a previous one of the even and the odd numbered stages or from an external source to the input unit, the input unit being adapted to control voltages of a first node and a second node, generating and outputting from the first output unit an emission control signal based on the voltages of the first node and the second node and output, and generating and outputting from the second output unit an inverted emission control signal based on the voltages of the first node and the second node.

For each of the odd and the even numbered stages, generating the emission control signal and the inverted emission control signal may include setting a width of the generated emission control signal and a width of the inverted emission control signal to correspond to a number of horizontal periods during which the control signal is supplied thereto.

Driving each of the even and odd numbered stages may include supplying a start signal as the control signal and an inverted start signal as the inverted control signal to a first one of the even and the odd numbered stages, and sequentially supplying the respectively generated inverted emission control signal and the respectively generated emission control signal to a subsequent one of the remaining even and the odd numbered stages to be driven as the control signal and the inverted control signal, respectively.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2009-0105984, filed on Nov. 4, 2009, in the Korean Intellectual Property Office, and entitled: "Emission Control Line Driver and Organic Light Emitting Display Device Using the Same" is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "between" two elements, it may be the only element between the two elements, or one or more intervening elements may also be present. It will also be understood that when a first element is described as being connected to a second element, the first element may not only be directly connected to the second element but may also be indirectly connected to the second element via one or more other elements. Further, some of the elements that are not essential to the complete understanding of the invention are omitted for clarity. Like reference numerals refer to like elements throughout the specification.

Figure 1:
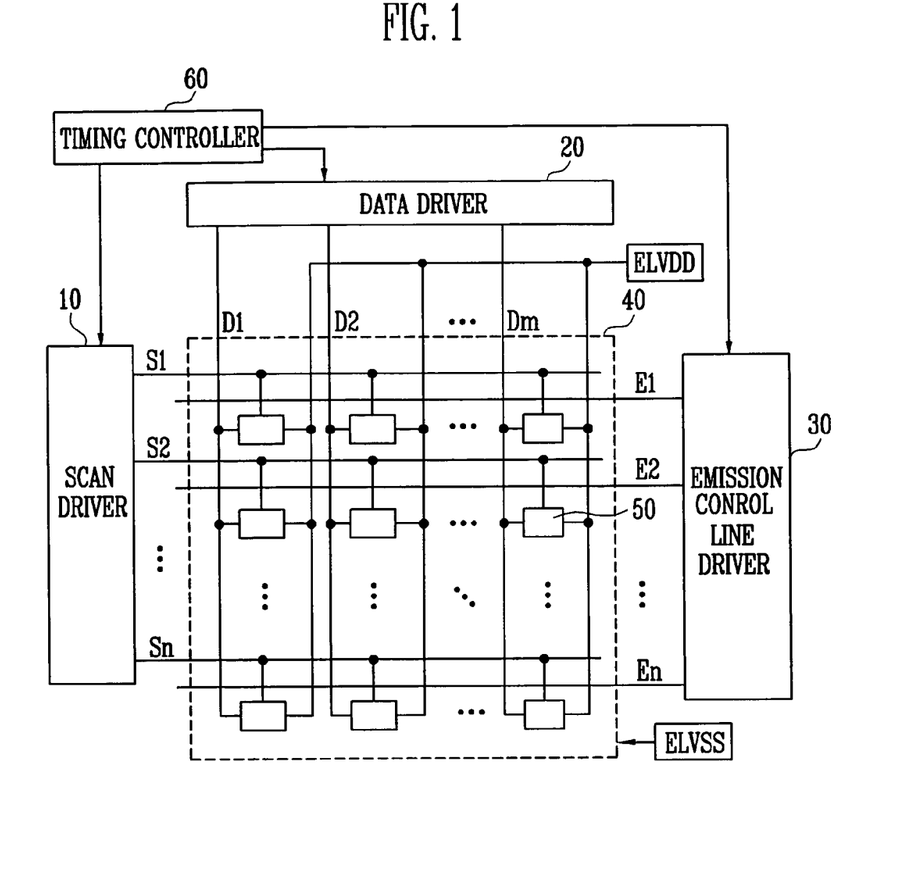
FIG. 1 illustrates a schematic diagram of an exemplary embodiment of an organic light emitting display device.

FIG. 1 illustrates a schematic diagram of an exemplary embodiment of an organic light emitting display device.

Referring to FIG. 1, the organic light emitting display device may include a pixel unit 40, a scan driver 10, a data driver 20, an emission control line driver 30, and a timing controller 60. The pixel unit 40 may include a plurality of pixels 50 that may be connected to scan lines S1 to Sn, data lines D1 to Dm, and emission control lines E1 to En. The scan driver 10 may drive the scan lines S1 to Sn. The data driver 20 may drive the data lines D1 to Dm. The emission control line driver 30 may drive the emission control lines E1 to En. The timing controller 60 may control the scan driver 10, the data driver 20, and the emission control line driver 30.

It should be understood, e.g., that although the scan driver 10 and the emission control line driver 30 are illustrated as being separate from each other in FIG. 1, embodiments are not limited thereto. For example, the emission control line driver 30 may be included in the scan driver 10.

The scan driver 10 may sequentially supply a scan signal to the scan lines S1 to Sn while being controlled by the timing controller 60. Then, the pixels 50 connected with the scan lines 51 to Sn may be sequentially selected.

The data driver 20 may supply a data signal to the data lines D1 to Dm while being controlled by the timing controller 60. Herein, the data driver 20 may supply the respective data signals to the data lines D1 to Dm when the scan signal is supplied. Then, the respective data signals may be supplied to the pixels 50 selected by the scan signal and each of the pixels 50 may be charged with voltage corresponding to the data signal supplied to itself.

The emission control line driver 30 may sequentially supply the respective emission control signal to the emission control lines E1 to En in accordance with the timing controller 60. Herein, an emission control signal supplied to an i-th emission control line may be superimposed on a scan signal supplied to an i-th scan line (i is a natural number). As such, when the scan signal and the emission control signal supplied to the same horizontal line are superimposed on each other, respective ones of the pixels 50 may be set to a non-emission state during a period when the data signal is supplied to the pixel 50. Meanwhile, a supply time, e.g., a width, of the emission control signal supplied from the emission control line driver 30 may be controlled by a driving signal, e.g., a start signal, supplied from the timing controller 60.

Figure 2:
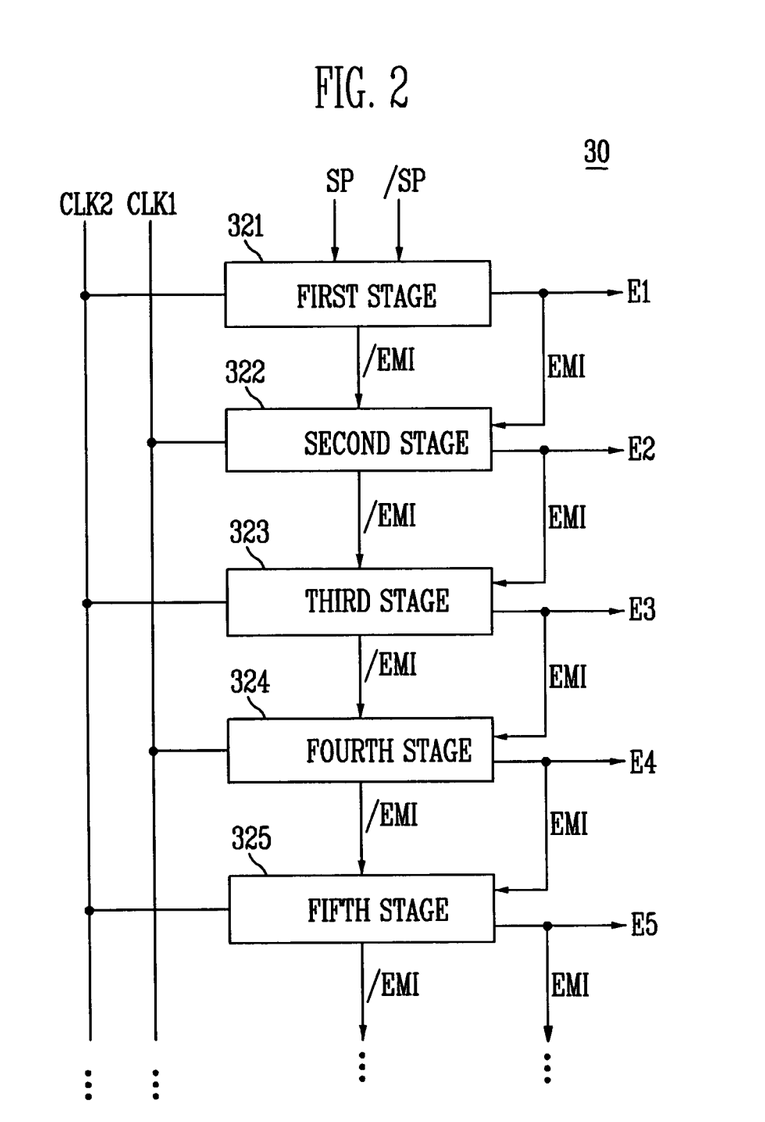
FIG. 2 illustrates a schematic diagram of exemplary stages of an exemplary embodiment of the emission control line driver of FIG. 1.

FIG. 2 illustrates a schematic diagram of exemplary stages 321, 322, 323, 324, 325 of an exemplary embodiment of the emission control line driver of FIG. 1. In FIG. 2, five stages 321 to 325 are merely shown for convenience as an exemplary embodiment, and it should be understood that embodiments are not limited thereto.

More particularly, the emission control line driver 30 may include n stages, e.g., 321 to 325. Each of the n stages may be adapted to supply an emission control signal to a respective one of n emission control lines E1 to En. The stages 321 to 325 may be connected to the emission control lines E1 to E5, respectively, and may be driven by one clock signal.

More specifically, the timing controller 60 may supply clock signals CLK1 and CLK2, a start signal SP, and an inverted start signal /SP to the emission control line driver 30. The first clock signal CLK1 may be supplied to even-numbered stages 322, 324, etc., and the second clock signal CLK2 may be supplied to odd-numbered stages 321, 323, etc. The first clock signal CLK1 and the second clock signal CLK2 may be set to have a same cycle, and may be set to be out of phase relative to each other. For example, the first clock signal CLK1 and the second clock signal CLK2 may be an inverse of each other.

The first stage 321 may receive the start signal SP and the inverted start signal /SP. The first stage 321 may receive the start signal SP and the inverted start signal /SP, and may output an emission control signal EMI to a first emission control line E1. The first stage 321 may supply the emission control signal EMI and an inverted emission control signal /EMI to another stage, e.g., the second stage 322. A width of the emission control signal EMI may be determined by a width of the start signal SP. For example, the width of the emission control signal EMI may be set to a width equal to the width of the start signal SP.

The emission control signal EMI and the inverted emission control signal /EMI may be supplied to the second stage 322 and may serve to perform the same roles as the start signal SP and the inverted start signal /SP, respectively. In embodiments, an i-th stage, e.g., 32(i), may supply the emission control signal EMI and the inverted emission control signal /EMI to an i+1-th stage 32(i+1) so as to generate the emission control signal EMI in the i+1-th stage 32(i+1).

The inverted start signal /SP may correspond to an inverse signal of the start signal SP and the inverted emission control signal /EMI may correspond to an inverse signal of the emission control signal EMI. For example, when the start signal SP is set to a low voltage, the inverted start signal /SP may be set to a high voltage, and when the emission control signal EMI is set to a high voltage, the inverted emission control signal /EMI may be set to a low voltage.

Figure 3:
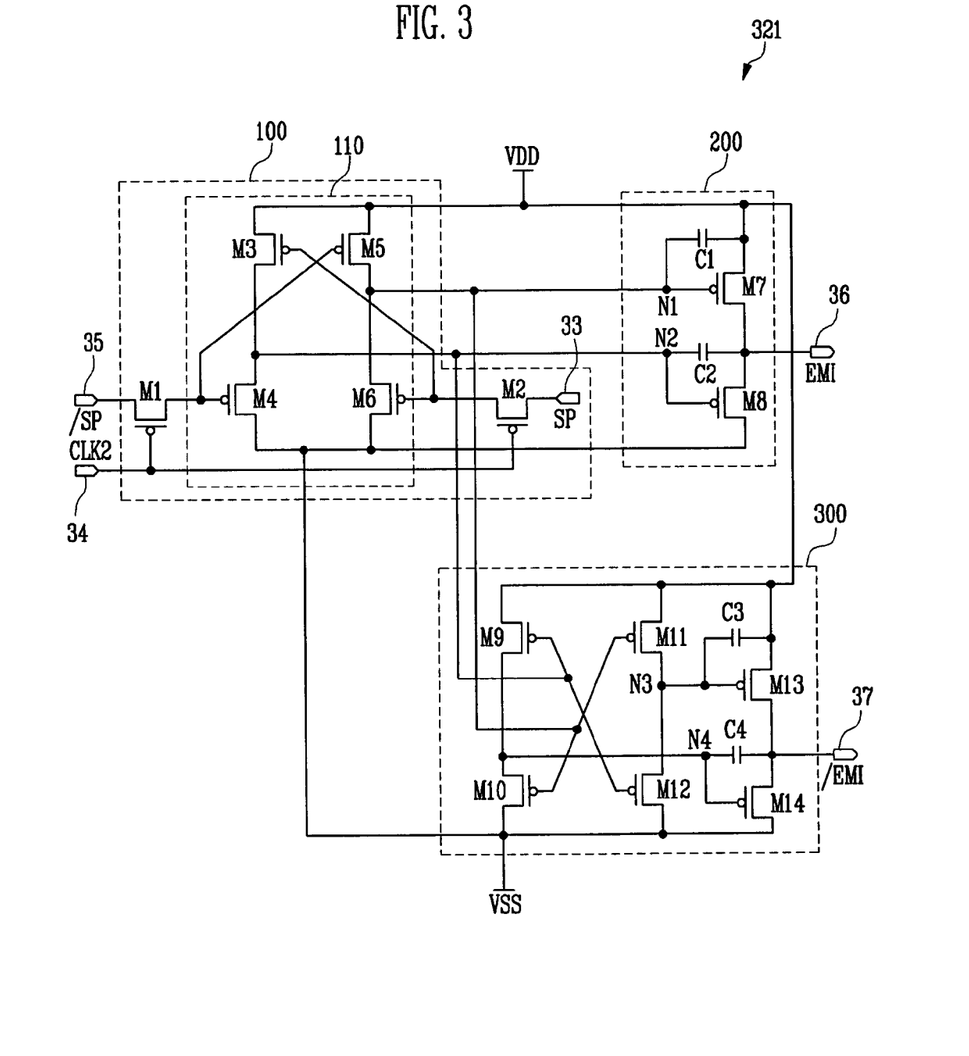
FIG. 3 illustrates a schematic diagram of an exemplary embodiment of a circuit configuration of the first stage of FIG. 2.

FIG. 3 illustrates a schematic diagram of an exemplary embodiment of a circuit configuration of the first stage 321 of FIG. 2. Features described below with regard to first stage 321 may be applied to one or more of the other stages, e.g., 322 to 325, and as discussed above, e.g., for the one or more other stages, e.g., 322 to 325, the emission control signal EMI and the inverted emission control signal /EMI may be respectively supplied from the previous one of the stages.

Referring to FIG. 3, the first stage 321 may include an input unit 100, a first output unit 200, and a second output unit 300.

The input unit 100 may receive the start signal SP, the inverted start signal /SP, and the second clock signal CLK2 and may control a voltage supplied to the first output unit 200 and the second output unit 300 based on the received signals. The input unit 100 may include a first transistor M1, a second transistor M2, and a driver 110.

A first electrode of the first transistor M1 may be connected to a third input terminal 35. The inverted start signal /SP may be supplied to the third input terminal 35. A second electrode of the first transistor M1 may be connected to the driver 110. A gate electrode of the first transistor M1 may be connected to a second input terminal 34. The first transistor M1 may control an electrical connection between the driver 110 and the third input terminal 35, and may be turned on or turned off based on a state of the second clock signal CLK2 supplied to the second input terminal 34.

A first electrode of the second transistor M2 may be connected to a first input terminal 33. The start signal SP may be supplied to the first input terminal 33. A second electrode of the second transistor M2 may be connected to the driver 110. A gate electrode of the second transistor M2 may be connected to the second input terminal 34. The second transistor M2 may control an electrical connection between the driver 110 and the first input terminal 33, and may be turned on or turned off based on the stage of the second clock signal CLK2.

The driver 110 may control a voltage supplied to a first node N1 and a second node N2 based on a voltage supplied from the first transistor M1 and the second transistor M2, respectively. More particularly, the driver 110 may supply a voltage of a second power VSS to the first node N1 when a low-level voltage is supplied to the first input terminal 33 and may supply a voltage of a first power VDD to the first node N1 when a high-level voltage is supplied to the first input terminal 33. The driver 110 may include a third transistor M3, a fourth transistor M4, a fifth transistor M5, and a sixth transistor M6. The first power VDD may correspond to a high-level voltage and the second power VSS may correspond to a low-level voltage.

The third transistor M3 and the fourth transistor M4 may be connected between the first power VDD and the second power VSS in series. A gate electrode of the third transistor M3 may be connected to the second electrode of the second transistor M2 and a gate electrode of the fourth transistor M4 may be connected to the second electrode of the first transistor M1.

The fifth transistor M5 and the sixth transistor M6 may be connected between the first power VDD and the second power VSS in series. Referring to FIG. 3, the fifth transistor M5 and the sixth transistor M6 may be connected in parallel with the third transistor M3 and the fourth transistor M4. A gate electrode of the fifth transistor M5 may be connected to the second electrode of the first transistor M1 and a gate electrode of the sixth transistor M6 may be connected to the second electrode of the second transistor M2.

A common node of the fifth transistor M5 and the sixth transistor M6 may correspond to the first node N1. A common node of the third transistor M3 and the fourth transistor M4 may correspond to the second node N2.

The first output unit 200 may generate the emission control signal EMI based on the voltage supplied to the first node and the voltage supplied to the second node N2. The first output unit 200 may supply the generated emission control signal EMI to a first output terminal 36. The first output unit 200 may include a seventh transistor M7, an eighth transistor M8, a first capacitor C1, and a second capacitor C2.

The seventh transistor M7 may be connected between the first output terminal 36 and the first power VDD. A gate electrode of the seventh transistor M7 may be connected to the first node N1. The seventh transistor M7 may supply the voltage of the first power VDD to the first output terminal 36 and may be turned on or turned off based on the voltage applied to the first node N1. During a period when the seventh transistor M7 is turned on to supply the voltage of the first power VDD to the first output terminal 36, an emission control signal having a high-level voltage may be supplied to the emission control line E1.

The eighth transistor M8 may be connected between the first output terminal 36 and the second power VSS. A gate electrode of the eighth transistor M8 may be connected to the second node N2. The eighth transistor M8 may supply the voltage of the second power VSS to the first output terminal 36 and may be turned on or turned off based on the voltage applied to the second node N2.

The first capacitor C1 may be connected between the gate electrode and a first electrode of the seventh transistor M7. The first capacitor C1 may be charged with a voltage corresponding to a turn-on or turn-off state of the seventh transistor M7. For example, the first capacitor C1 may be charged with voltage at which the seventh transistor M7 may be turned on when the seventh transistor M7 is turned on and may be charged with a voltage at which the seventh transistor M7 may be turned off when the seventh transistor M7 is turned off.

The second capacitor C2 may be connected between the gate electrode and a first electrode of the eighth transistor M8. The first capacitor C2 may be charged with voltage corresponding to a turn-on or turn-off of the eighth transistor M8.

The second output unit 300 may generate the respective inverted emission control signal /EMI based on the voltage output to the first node N1 and the voltage output to the second node N2 of the input unit 100. The second output unit 300 may supply the generated inverted emission control signal /EMI to a second output terminal 37. The second output unit 300 may include a ninth transistor M9, a tenth transistor M10, an eleventh transistor M11, a twelfth transistor M12, a thirteenth transistor M13, a fourteenth transistor M14, a third capacitor C3, and a fourth capacitor C4.

The ninth transistor M9 and the tenth transistor M10 may be connected between the first power VDD and the second power VSS in series. A gate electrode of the ninth transistor M9 may be connected to the second node N2 and a gate electrode of the tenth transistor M10 may be connected to the first node N1.

The eleventh transistor M11 and the twelfth transistor M12 may be connected between the first power VDD and the second power VSS in series. In such cases, the eleventh transistor M11 and the twelfth transistor M12 may be connected in parallel with the ninth transistor M9 and the tenth transistor M10. A gate electrode of the eleventh transistor M11 may be connected to the first node N1 and a gate electrode of the twelfth transistor M12 may be connected to the second node N2. A common node of the ninth transistor M9 and the tenth transistor M10 may be set as a fourth node N4 and a common node of the eleventh transistor M11 and the twelfth transistor M12 may be set as a third node N3.

The thirteenth transistor M13 may be connected between the first power VDD and the second output terminal 37. A gate electrode of the thirteenth transistor M13 may be connected to the third node N3. The thirteenth transistor M13 may supply the voltage of the first power VDD to the second output terminal 37, and may be turned on or turned off based on a voltage applied to the third node N3.

The fourteenth transistor M14 may be connected between the second output terminal 37 and the second power VSS. A gate electrode of the fourteenth transistor M14 may be connected to the fourth node N4. The fourteenth transistor M14 may supply the voltage of the second power VSS to the second output terminal 37, and may be turned on or turned off based on a voltage applied to the fourth node N4.

The third capacitor C3 may be connected between the gate electrode and a first electrode of the thirteenth transistor M13. The third capacitor C3 may be charged with a voltage corresponding to a turn-on or turn-off state of the thirteenth transistor M13.

The fourth capacitor C4 may be connected between the gate electrode and a first electrode of the fourteenth transistor M14. The fourth capacitor C4 may be charged with a voltage corresponding to a turn-on or turn-off state of the fourteenth transistor M14.

Figure 4:
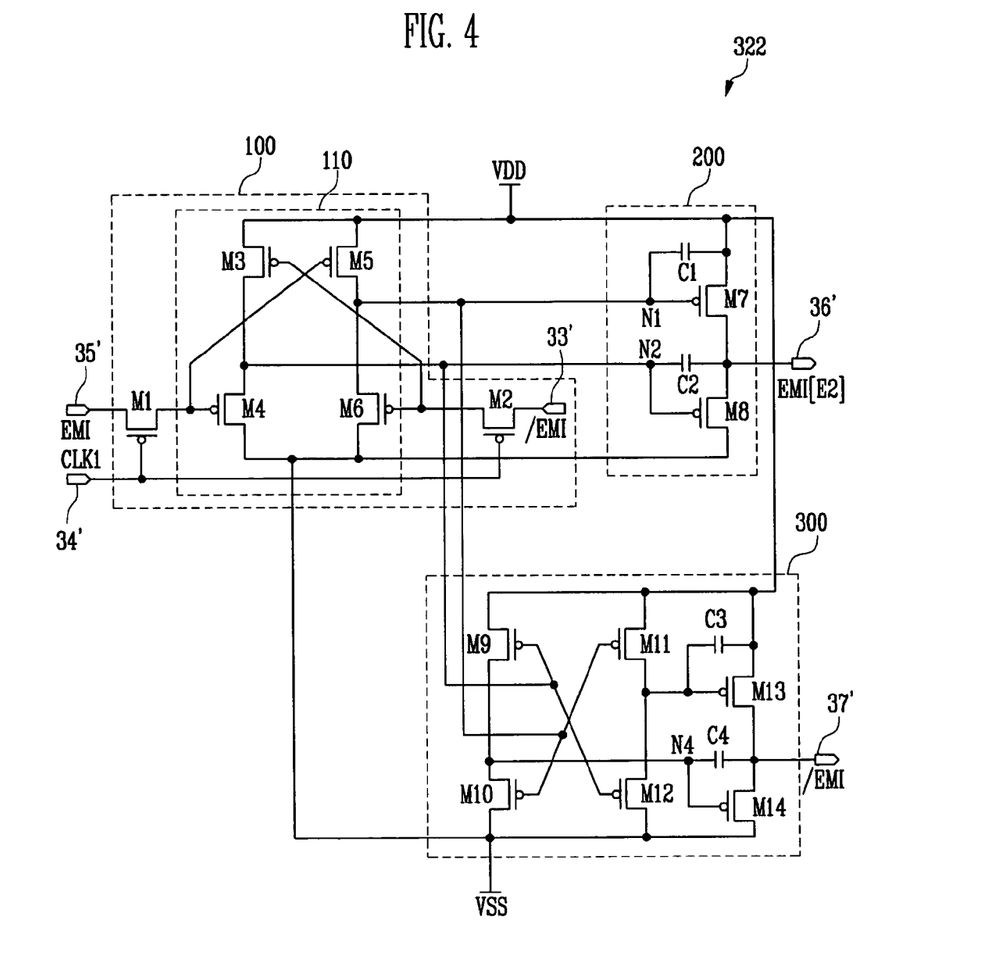
FIG. 4 illustrates a schematic diagram of an exemplary embodiment of a circuit configuration of an even-numbered stage of FIG. 2.

Remaining stages, e.g., 322, 323, etc. may have the same configuration as the circuit shown in FIG. 3. FIG. 4 illustrates a schematic diagram of an exemplary embodiment of a circuit configuration of an even-numbered stage, e.g., the second stage 322, of FIG. 2. As discussed above, the inverted emission control signal /EMI of the previous stage, e.g., the first stage 321, may be supplied to a respective first input terminal 33' of the next stage, e.g., the second stage 322, and the emission control signal EMI of the previous stage, e.g., the first stage 321, may be supplied to a third input terminal 35' of the next stage, e.g., the second stage 322. The first clock signal CLK1 may be input to a second input terminal 34' of the even-numbered stage, e.g., the second stage 322, as shown in FIG. 4. A respective emission control signal EMI generated by the even numbered stage, e.g., the second stage 322, may be supplied to a first output terminal 36' and a respective inverted emission control signal /EMI generate by the even numbered stage, e.g., the second stage 322, may be supplied to a second output terminal 37'.

Figure 5:
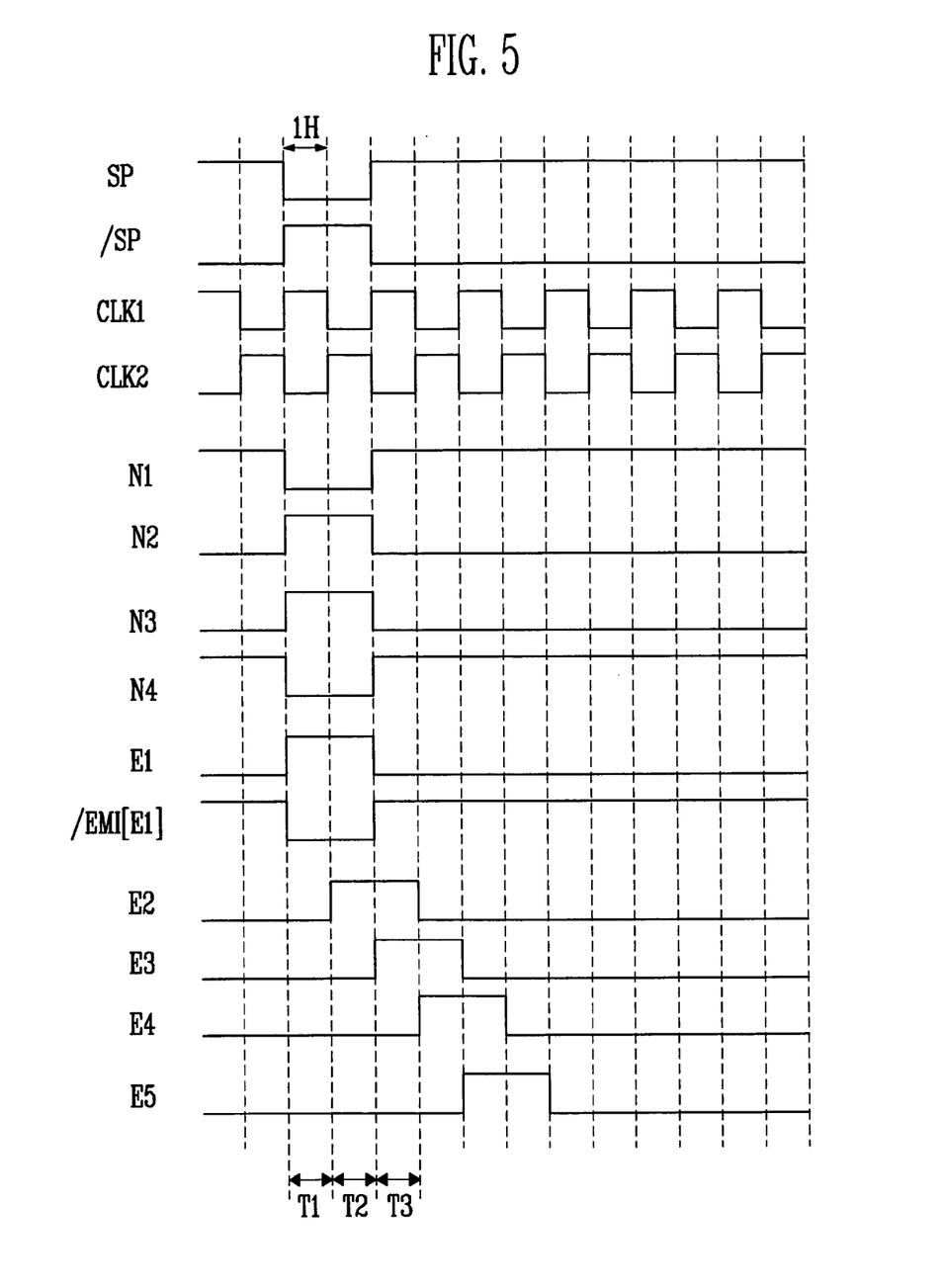
FIG. 5 illustrates a waveform diagram of exemplary signals employable according to an exemplary method for driving the stage of FIG. 3.

FIG. 5 illustrates a waveform diagram of exemplary signals employable according to an exemplary method for driving the stage of FIG. 3. Referring to FIG. 5, during an exemplary operation process of a stag, a cycle of each of the first and second clock signals CLK1 and CLK2 may be correspond to two horizontal periods 2H and a phase of the clock signals CLK1, CLK2 may be changed, e.g., inverted, corresponding to each one horizontal period 1H. Referring to FIG. 5, in the exemplary embodiment, the start signal SP is supplied, e.g., has a low state, during two horizontal periods.

An exemplary operation process is described below with reference to FIGS. 3 and 5. Referring to FIG. 5, during a first period T1 corresponding to one horizontal period 1H, the first clock signal CLK1 having a high level may be supplied, and the second clock signal CLK2 having a low level may be supplied.

When the low second clock signal CLK2 is supplied, the first transistor M1 and the second transistor M2 may be turned on. When the first transistor M1 is turned on, the third input terminal 35 may be connected with the gate electrodes of the fourth and fifth transistors M4 and M5. When the second transistor M2 is turned on, the first input terminal 33 may be connected with the gate electrodes of the third and sixth transistors M3 and M6.

The start signal SP and the inverted start signal /SP may be supplied during the first period T1. When the inverted start signal /SP is supplied to the third input terminal 35, the fourth transistor M4 and the fifth transistor M5 may be turned off. When the start signal SP is supplied to the first input terminal 33, the third transistor M3 and the sixth transistor M6 may be turned on.

When the third transistor M3 is turned on, the voltage of the first power VDD may be supplied to the second node N2. When the sixth transistor M6 is turned on, the voltage of the second power VSS may be supplied to the first node N1.

When the voltage of the first power VDD is supplied to the second node N2, the eighth transistor M8 may be turned off. When the voltage of the second power VSS is supplied to the first node N1, the seventh transistor M7 may be turned on. When the seventh transistor M7 is turned on, the voltage of the first power VDD may be supplied to the first output terminal 36. That is, the emission control signal EMI having, e.g., a high level, may be output from the first output terminal 36. During the first period T1, the first capacitor C1 may be charged with a voltage corresponding to the turn-on state of the seventh transistor M7 and the second capacitor C2 may be charged with voltage corresponding to a turn-off state of the eighth transistor M8.

Referring still to FIGS. 3 and 5, when the voltage of the first power VDD is supplied to the second node N2, the ninth transistor M9 and the twelfth transistor M12 may be turned off. When the voltage of the second power VSS is supplied to the first node N1, the tenth transistor M10 and the eleventh transistor M11 may be turned on. When the tenth transistor M10 is turned on, the second power VSS may be supplied to the fourth node N4 and when the eleventh transistor M11 is turned on, the first power VDD may be supplied to the third node N3. At this time, the fourteenth transistor M14 connected with the fourth node N4 may be turned on and may supply the voltage of the second power VSS to the second output terminal 37. That is, the inverted emission control signal /EMI may be output to the second output terminal 37. Meanwhile, during the first period T1, the third capacitor C3 may be charged with a voltage corresponding to a turn-off of the thirteenth transistor M13 and the fourth capacitor C4 may be charged with voltage corresponding to a turn-on state of the fourteenth transistor M14.

During a second period T2, the second clock signal CLK2 having a high level may be supplied, such that the first transistor M1 and the second transistor M2 may be turned off. In this case, the first output terminal 36 and the second output terminal 37 may maintain their respective output voltage of the first period T1.

More specifically, during the second period T2, the seventh transistor M7 may maintain a turn-on state based on the voltage charged in the first capacitor C1 and the eighth transistor M8 may maintain a turn-off state based on the voltage charged in the second capacitor C2 during the first period T1. Further, during the second period T2, the thirteenth transistor M13 may maintain the turn-off state based on the voltage charged in the third capacitor C3 and the fourteenth transistor M14 may maintain the turn-on state based on the voltage charged in the fourth capacitor C4 during the first period T1.

During a third period T3, the second clock signal CLK2 having a low level may be supplied, such that the first transistor M1 and the second transistor M2 may be turned on. Referring to FIG. 5, during the third period T3, the start signal SP may not be supplied to the first input terminal 33, i.e., the start signal SP may have a high-level, and the inverted start signal /SP may be supplied to the third input terminal 35, i.e., the inverted start signal /SP may have a low-level.

Referring to FIGS. 3 and 5, during the third period T3, the fourth transistor M4 and the fifth transistor M5 may be turned on. When the fourth transistor M4 is turned on, the voltage of the second power VSS may be supplied to the second node N2 and when the fifth transistor M5 is turned on, the voltage of the first power VDD may be supplied to the first node N1.

When the voltage of the first power VDD is supplied to the first node N1, the seventh transistor M7 may be turned off. When the voltage of the second power VSS is supplied to the second node N2, the eighth transistor M8 may be turned on. When the eighth transistor M8 is turned on, the voltage of the second power VSS may be supplied to the first output terminal 36.

When the voltage of the first power VDD is supplied to the first node N1, the tenth transistor M10 and the eleventh transistor M11 may be turned off. When the voltage of the second power VSS is supplied to the second node N2, the ninth transistor M9 and the twelfth transistor M12 may be turned on. When the ninth transistor M9 is turned on, the first power VDD may be supplied to the fourth node N4 and when the twelfth transistor M12 is turned on, the second power VSS may be supplied to the third node N3. At this time, the thirteenth transistor M13 connected with the third node N3 may be turned on and may supply the voltage of the first power VDD to the second output terminal 37. Thereafter, the first output terminal 36 and the second output terminal 37 may maintain their respective output voltage of the third period T3 until the next start signal SP and inverted start signal /SP are input.

As discussed above, the emission control signal EMI and the inverted emission control signal /EMI may be supplied to the second stage 322 and may serve to perform the same roles as the start signal SP and the inverted start signal /SP, respectively. Using the exemplary process described above, and the first clock signal CLK1 supplied to the even number stages, e.g., the second stage 322, the second stage 322 may supply the emission control signal EMI to the second emission control line E2 based on the emission control signal EMI and the inverted emission control signal /EMI supplied from the first stage 321. In embodiments, the emission control signal may be sequentially output to the emission control lines E2 to En while the stages, e.g., 321 to 325, sequentially perform the above-described processes.

Meanwhile, in the driving waveform shown in FIG. 5, it is assumed that a supply time of the start signal SP is accurately synchronized with a falling time of the second clock signal CLK2. However, the falling time of the second clock signal CLK2 may not accurately coincide with the supply time of the start signal SP due to, e.g., an influence of some electromagnetic waves, etc.

Figure 6:
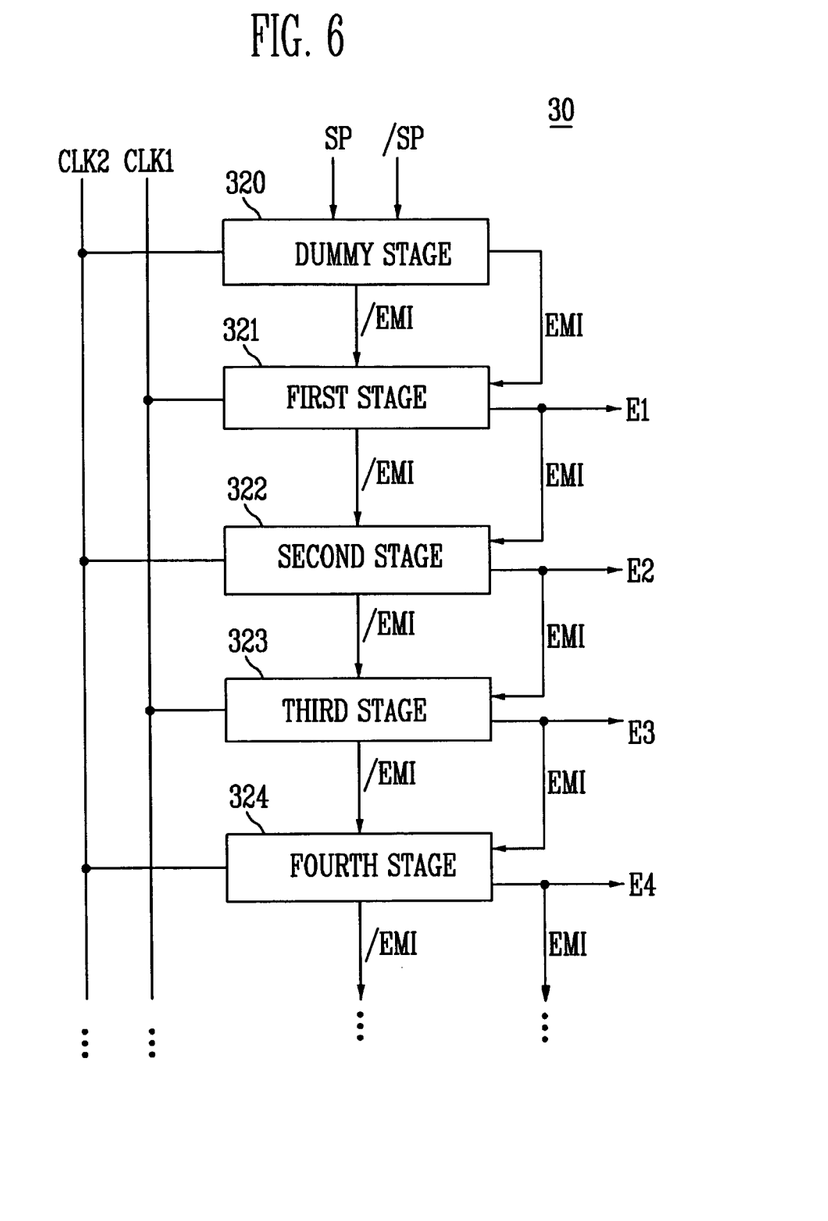
FIG. 6 illustrates a schematic diagram of exemplary stages of another exemplary embodiment of the emission control line driver of FIG. 1.

FIG. 6 illustrates a schematic diagram of exemplary stages of another exemplary embodiment of the emission control line driver of FIG. 1. In embodiments, in order to reduce an occurrence of and/or prevent a problem from being generated due to the inconsistency between the falling time of the second clock signal CLK2 and the supply time of the start signal SP, a dummy stage 320 may be additionally provided as shown in FIG. 6.

The dummy stage 320 may be supplied with, e.g., one of the clock signals, e.g., CLK2, the start signal SP, and the inverted start signal /SP and may generate the emission control signal EMI and the inverted emission control signal /EMI based on the signals supplied thereto.

Figure 7:
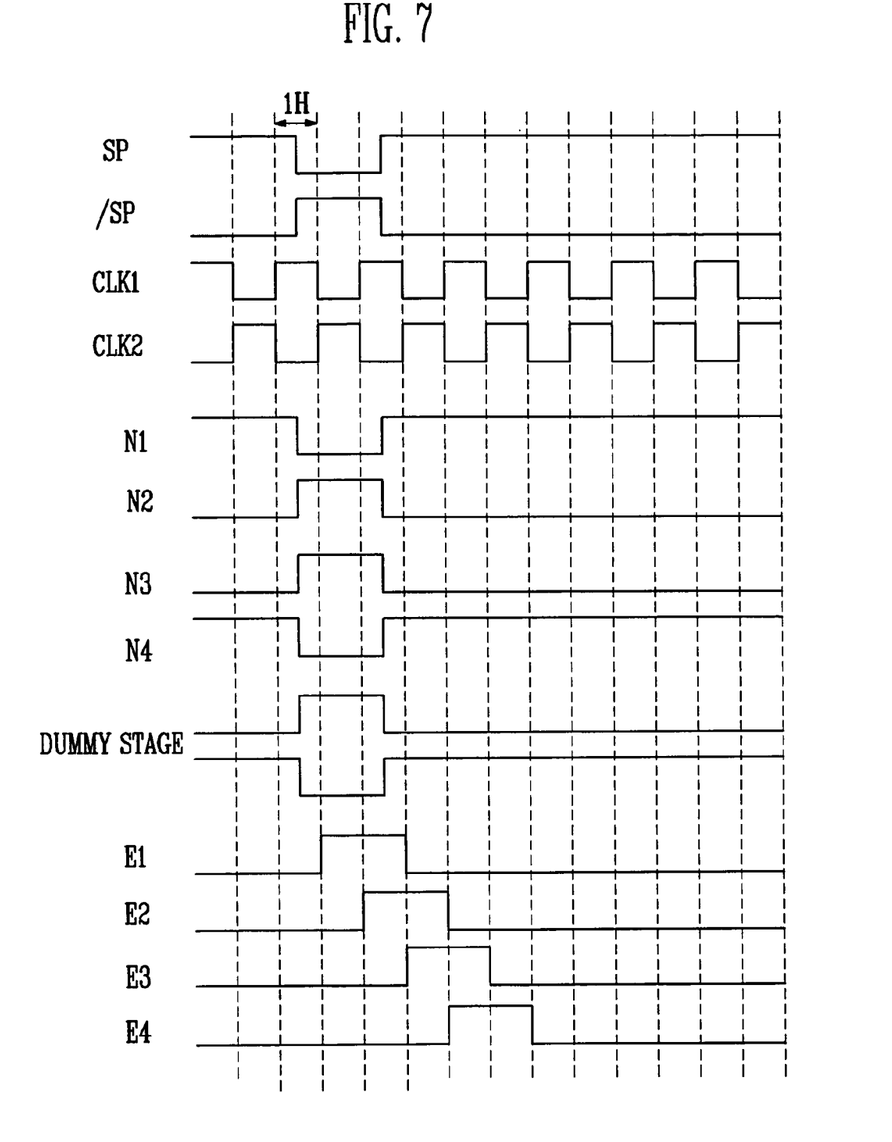
FIG. 7 illustrates a waveform diagram of exemplary signals employable according to an exemplary method of operating the dummy stage of FIG. 6.

FIG. 7 illustrates a waveform diagram of exemplary signals employable according to an exemplary method of operating the dummy stage 320 of FIG. 6.

As shown in FIG. 7, when the start signal SP and the inverted start signal /SP are supplied not to coincide with the rising or falling time of the clock signals CLK1, CLK2, the generated emission control signal EMI and the generated inverted emission control signal /EMI output from the dummy stage 320 may also not to coincide with the rising or falling time of the clock signals CLK1 and CLK2.

However, the first stage 321 receiving the emission control signal EMI and the inverted emission control signal /EMI from the dummy stage 320 may generate and supply the emission control signal EMI to the respective emission control line E1 in synch with the falling or rising time of the clock signal CLK1 or CLK2. In embodiments employing such a dummy stage, e.g., in the stages, e.g., 321, 322, etc., other than the dummy stage 320, the generated emission control signal EMI may be synchronized with the clock signal CLK1, CLK2.

Figure 8:
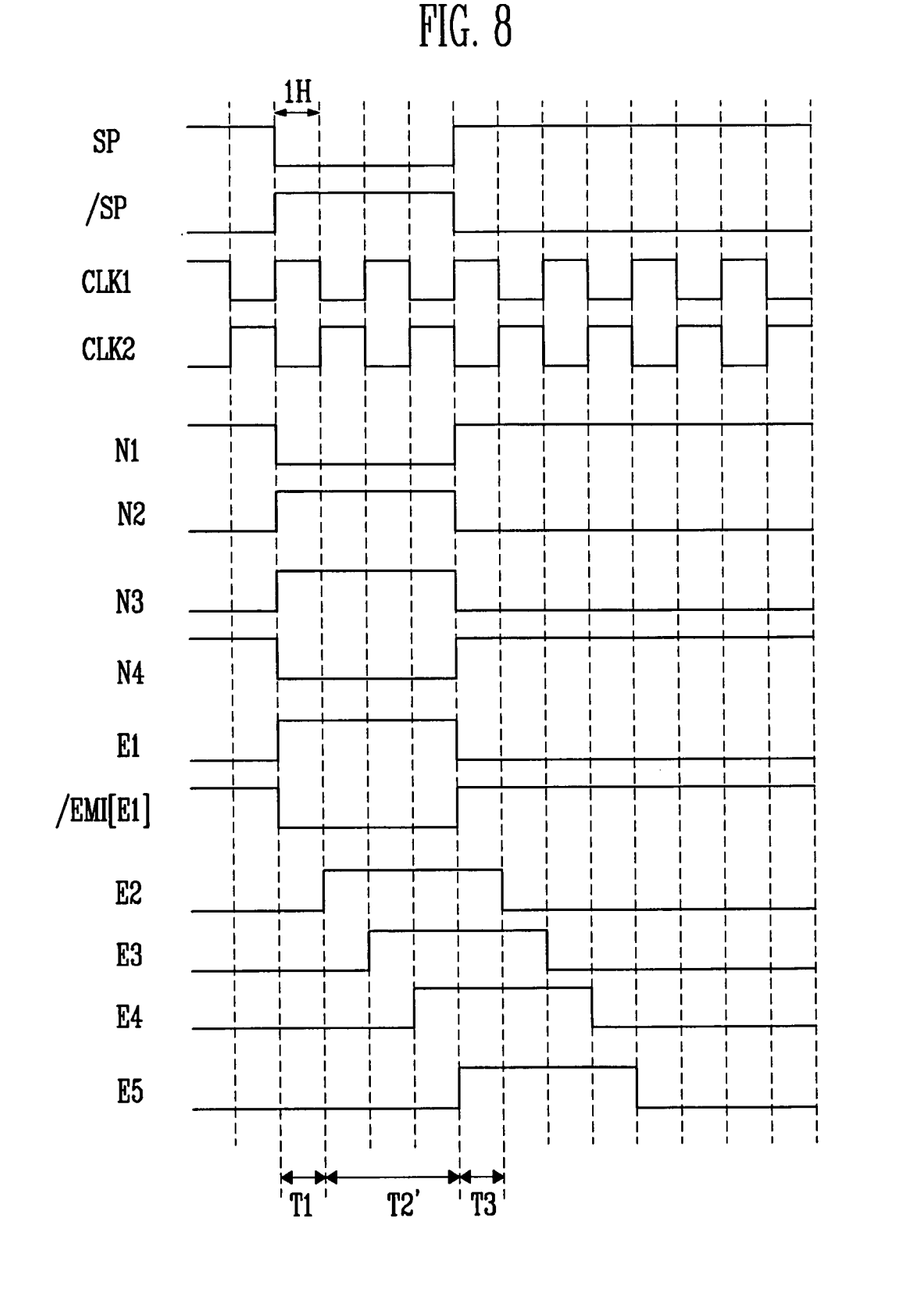
FIG. 8 illustrates a waveform diagram of exemplary signals employable according to another exemplary method for driving the stage of FIG. 3.

FIG. 8 illustrates a waveform diagram of exemplary signals employable according to another exemplary method for driving the exemplary first stage 321 of FIG. 3. In FIG. 8, it is assumed that the start signal SP is supplied during four horizontal periods 4H.

Referring to FIG. 8, during the first period T1, the first clock signal CLK1 may have a high level and the second clock signal CLK2 may have a low level.

Referring to FIGS. 3 and 8, during the first period T1, when the low second clock signal CLK2 is supplied, the first transistor M1 and the second transistor M2 may be turned on. When the first transistor M1 is turned on, the third input terminal 35 may be connected with the gate electrodes of the fourth and fifth transistors M4 and M5. When the second transistor M2 is turned on, the first input terminal 33 may be connected with the gate electrodes of the third and sixth transistors M3 and M6.

The start signal SP and the inverted start signal /SP may be supplied during the first period T1. When the inverted start signal /SP is supplied, e.g., the inverted start signal /SP has a high level, to the third input terminal 35, the fourth transistor M4 and the fifth transistor M5 may be turned off. When the start signal SP is supplied, e.g., the start signal SP has a low level, to the first input terminal 33, the third transistor M3 and the sixth transistor M6 may be turned on.

When the third transistor M3 is turned on, the voltage of the first power

VDD may be supplied to the second node N2. When the sixth transistor M6 is turned on, the voltage of the second power VSS may be supplied to the first node N1.

When the voltage of the first power VDD is supplied to the second node N2, the eighth transistor M8 may be turned off. When the voltage of the second power VSS is supplied to the first node N1, the seventh transistor M7 may be turned on. When the seventh transistor M7 is turned on, the voltage of the first power VDD may be supplied to the first output terminal 36. That is, the emission control signal EMI may be output from the first output terminal 36. During the first period T1, the first capacitor C1 may be charged with a voltage corresponding to a turn-on state of the seventh transistor M7 and the second capacitor C2 may be charged with a voltage corresponding to a turn-off state of the eighth transistor M8.

Meanwhile, when the voltage of the first power VDD is supplied to the second node N2, the ninth transistor M9 and the twelfth transistor M12 may be turned off. In addition, when the voltage of the second power VSS is supplied to the first node N1, the tenth transistor M10 and the eleventh transistor M11 may be turned on. When the tenth transistor M10 is turned on, the second power VSS may be supplied to the fourth node N4. When the eleventh transistor M11 is turned on, the first power VDD may be supplied to the third node N3. At this time, the fourteenth transistor M14 connected with the fourth node N4 may be turned on to supply the voltage of the second power VSS to the second output terminal 37. Meanwhile, during the first period T1, the third capacitor C3 may be charged with a voltage corresponding to a turn-off state of the thirteenth transistor M13. The fourth capacitor C4 may be charged with a voltage corresponding to a turn-on state of the fourteenth transistor M14.

During a second period T2', while supply of the start signal SP to the first input terminal 33 may be maintained, e.g., the start signal SP may be maintained at a low level, and the clock signals CLK1 and CLK2 may be supplied. More particularly, the clock signals CLK1 and CLK2 may be alternately supplied relative to each horizontal period 1H. When the first clock signal CLK1 has a low level, the second clock signal CLK2 may have a high level, and when the first clock signal CLK1 has a high level, the second clock signal CLK2 may have a low level. During the second period T2', the output obtained during the first period T1 may be maintained based on voltages charged in the first capacitor C1, the second capacitor C2, the third capacitor C3, and the fourth capacitor C4. Referring to FIG. 8, the second period T2' may correspond, e.g., to three horizontal periods 3H.

During the third period T3, the second clock signal CLK2 may be supplied, e.g., have a low level, and the first clock signal CLK1 may have a high level. Referring to FIGS. 3 and 8, under such conditions, the first transistor M1 and the second transistor M2 may be turned on. Herein, during the third period T3, the start signal SP may not be supplied, e.g., may have a high level, to the first input terminal 33 and the inverted start signal /SP may not be supplied, e.g., may have a low level, to the third input terminal 35.

Therefore, during the third period T3, the fourth transistor M4 and the fifth transistor M5 may be turned on. When the fourth transistor M4 is turned on, the voltage of the second power VSS may be supplied to the second node N2. When the fifth transistor M5 is turned on, the voltage of the first power VDD may be supplied to the first node N1.

When the voltage of the first power VDD is supplied to the first node N1, the seventh transistor M7 may be turned off. When the voltage of the second power VSS is supplied to the second node N2, the eighth transistor M8 may be turned on. When the eighth transistor M8 is turned on, the voltage of the second power VSS may be supplied to the first output terminal 36.

Meanwhile, when the voltage of the first power VDD is supplied to the first node N1, the tenth transistor M10 and the eleventh transistor M11 may be turned off. In addition, when the voltage of the second power VSS is supplied to the second node N2, the ninth transistor M9 and the twelfth transistor M12 may be turned on. When the ninth transistor M9 is turned on, the first power VDD may be supplied to the fourth node N4. When the twelfth transistor M12 is turned on, the second power VSS may be supplied to the third node N3. At this time, the thirteenth transistor M13 connected with the third node N3 may be turned on and may supply the voltage of the first power VDD to the second output terminal 37.

As described above, in embodiments, a width of an emission control signal EMI may be determined by a width of the start signal SP. In other words, when the width of the start signal SP is set wide, the width of the emission control signal EMI may also be set wide and when the width of the start signal SP is set narrow, the width of the emission control signal EMI may also be set narrow. More particularly, e.g., in the exemplary embodiment of FIG. 5, the start pulse SP is supplied, e.g., has a low level, during two horizontal periods 2H, and thus, the emission control signal respectively to the emission control lines E1 to E5 is supplied, e.g., has a high level, during two horizontal periods 2H. In the exemplary embodiment of FIG. 8, the start pulse SP is supplied, e.g., has a low level, during four horizontal periods 4H, and thus, the emission control signal respectively to the emission control lines E1 to E5 is supplied, e.g., has a high level, during four horizontal periods 4H. Therefore, in embodiments, it is possible to arbitrarily adjust a width of the emission control signal EMI by controlling a width of the start signal SP supplied from the timing controller 60.

FIGS. 9A, 9B, 9C, and 9D illustrate timing diagrams of simulation results of stage circuits relative to a width of a respective start signal SP.

Figure 9A:
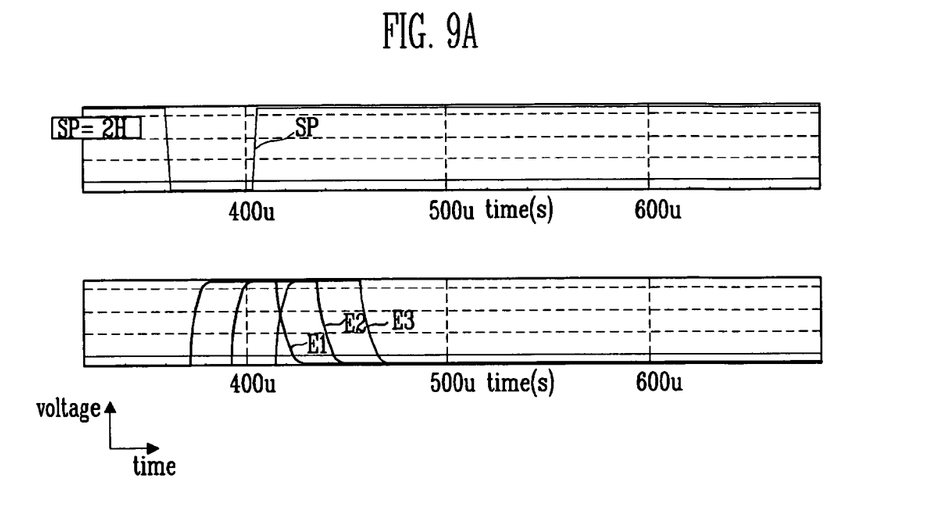
FIGS. 9A, 9B, 9C and 9D illustrate timing diagrams of simulation results of stage circuits relative to a width of a respective start signal.

In FIG. 9A, the start signal SP is supplied, e.g., has a low level, during two horizontal periods 2H. In this case, in each of the first to third stages 321, 322, and 323, the emission control signal EMI is output during two horizontal periods 2H.

Figure 9B:
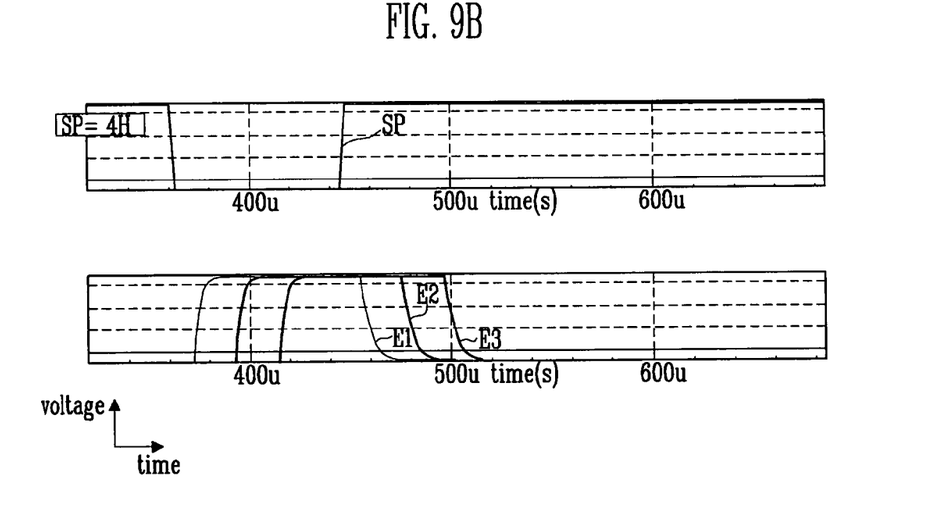

In FIG. 9B, the start signal SP is supplied, e.g., has a low level, during four horizontal periods 4H. In this case, in each of the first, second, and third stages 321, 322, and 323, the emission control signal EMI is output during four horizontal periods 4H.

Figure 9C:
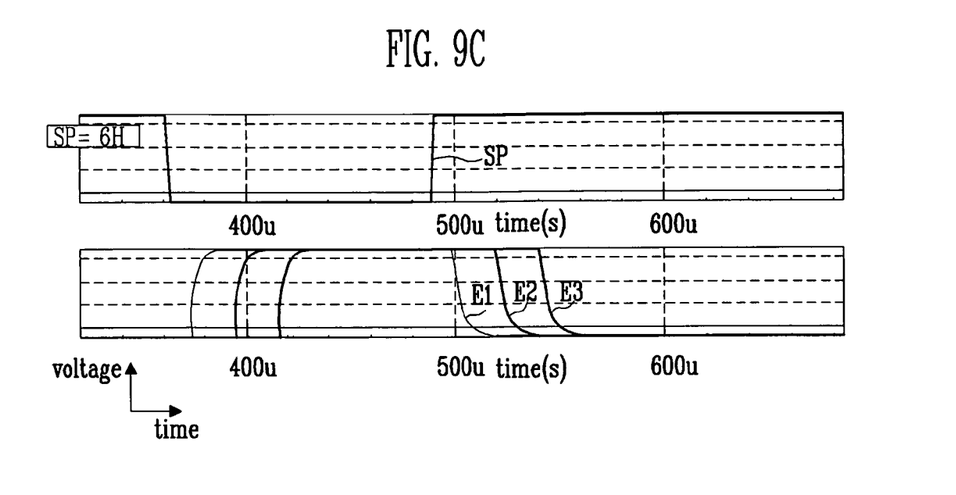

In FIG. 9C, the start signal SP is supplied, e.g., has a low level, during six horizontal periods 6H. In this case, in each of the first, second, and third stages 321, 322, and 323, the emission control signal EMI is output during six horizontal periods 6H.

Figure 9D:
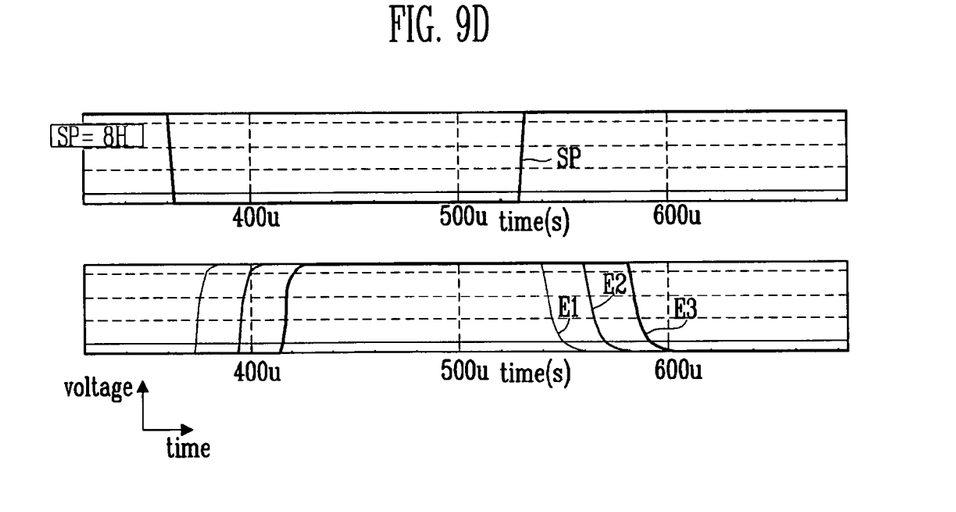

In FIG. 9D, the start signal SP is supplied, e.g., has a low level, during eight horizontal periods 8H. In this case, in each of the first, second, and third stages 321, 322, and 323, the emission control signal EMI is output during eight horizontal periods 8H.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An emission control line driver, comprising:
   even-numbered stages that are connected to even-numbered emission control lines, respectively, and are driven by a first clock signal; and
   odd-numbered stages that are connected to odd-numbered emission control lines, respectively, and are driven by a second clock signal,
   wherein each of the stages includes,
      an input unit adapted to receive a control signal and an inverted control signal output from a previous one of the even and odd numbered stages or from an external source, the input unit being adapted to control voltages of a first node and a second node;
      a first output unit adapted to generate an emission control signal based on the voltages of the first node and the second node; and
      a second output unit adapted to generate an inverted emission control signal based on the voltages of the first node and the second node.

2. The emission control line driver as claimed in claim 1, wherein the control signal is one of an emission control signal output from the previous one of the stages and an externally supplied start signal, and the inverted control signal is one of an inverted emission control signal output from the previous one of the stages and an externally supplied inverted start signal.

3. The emission control line driver as claimed in claim 2, further comprising:
   a dummy stage adapted to receive one of the first signal and the second clock signal and the start signal and the inverted start signal and to generate the emission control signal and the inverted emission control signal.

4. The emission control line driver as claimed in claim 1, wherein one cycle of the first clock signal and the second clock signal corresponds to two horizontal periods, and the first clock signal and the second clock signal are inverse in phase relative to each other.

5. The emission control line driver as claimed in claim 1, wherein a width of the generated emission control signal corresponds to a number of horizontal periods during which the start pulse is supplied, and a width of the generated emission inverted emission control signal corresponds to a number of horizontal periods during which the inverted start pulse is supplied.

6. The emission control line driver as claimed in claim 5, wherein the start signal is supplied when the start signal is set to a low level voltage, and the inverted start signal is supplied when the inverted start signal is set to a high level voltage.

7. The emission control line driver as claimed in claim 1, wherein the input unit includes:
   a driver adapted to control the voltages of the first node and the second node;
   a first transistor connected between the driver and a third input terminal, a gate electrode of the first transistor being connected to a second input terminal receiving the first clock signal or the second clock signal; and
   a second transistor connected between the driver and a first input terminal, a gate electrode of the second transistor being connected with the second input terminal.

8. The emission control line driver as claimed in claim 7, wherein the first input terminal receives one of the control signal and the inverted control signal, and the third input terminal receives the other of the control signal and the inverted control signal.

9. The emission control line driver as claimed in claim 8, wherein the first input terminal receives the control signal and the second input terminal receives the inverted control signal.

10. The emission control line driver as claimed in claim 9, wherein the control signal one of an inverted emission control signal from the previous stage or a start signal and the inverted control signal is an emission control signal from the previous stage or an inverted start signal.

11. The emission control line driver as claimed in claim 7, wherein the driver includes:
    a third transistor and a fourth transistor connected in series between a first power source and a second power source that is lower than the first power source, a common node of the third and the fourth transistors being connected with the second node; and
    a fifth transistor and a sixth transistor connected in series between the first power and the second power, a common node of the fifth and the sixth transistors being connected with the first node.

12. The emission control line driver as claimed in claim 1, wherein the first output unit includes:
    a seventh transistor connected between a first power source and a first output terminal, a gate electrode of the seventh transistor being connected to the first node;
    an eighth transistor connected between a second power source that is lower than the first power and the first output terminal, a gate electrode of the eighth transistor being connected with the second node;
    a first capacitor connected between a gate electrode and the gate electrode of the seventh transistor; and
    a second capacitor connected between a first electrode and the gate electrode of the eighth transistor.

13. The emission control line driver as claimed in claim 1, wherein the second output unit includes:
    a ninth transistor and a tenth transistor connected in series between a first power source and a second power source that is lower than the first power source, a common node of the ninth and the tenth transistors being connected with a fourth node;
    an eleventh transistor and a twelfth transistor connected in series between the first power source and the second power source, a common node of the eleventh and the twelfth transistors being connected with a third node;
    a thirteenth transistor connected between the first power and the second output terminal, a gate electrode of the thirteenth transistor being connected to the third node;
    a fourteenth transistor connected between the second power source and the second output terminal, a gate electrode of the fourteenth transistor being connected to the fourth node;
    a third capacitor connected between a first electrode and the gate electrode of the thirteenth transistor; and
    a fourth transistor connected between a first electrode and the gate electrode of the fourteenth transistor,
    wherein gate electrodes of the ninth transistor and the twelfth transistor are connected to the second node and gate electrodes of the tenth transistor and the eleventh transistor are connected to the first node.

14. The emission control line driver as claimed in claim 1, wherein a first one of the stages is driven by receiving the start signal and the inverted start signal as the control signal and the inverted control signal, respectively, and remaining ones of the stages are driven by receiving the emission control signal and the inverted emission control signal of a respective one of the previous stages as the inverted control signal and the control signal, respectively.

15. The emission control line driver as claimed in claim 1, wherein a width of the emission control signal and a width of the inverted emission control signal generated by each of the stages corresponds to a number of horizontal periods during which the control signal is supplied thereto.

16. An organic light emitting display device, comprising:
a scan driver adapted to sequentially supply a scan signal to scan lines;
a data driver adapted to supply a respective data signal to data lines;
an emission control line driver adapted to supply a respective emission control signal to emission control lines; and
pixels positioned at intersection portions of the scan lines, the emission control lines, and the data lines, the emission control line driver, including:
even-numbered stages that are connected to even-numbered emission control lines, respectively, and are driven by a first clock signal; and
odd-numbered stages that are connected to odd-numbered emission control lines, respectively, and are driven by a second clock signal, wherein each of the stages includes,
an input unit adapted to receive a control signal and an inverted control signal output from a previous one of the even and odd numbered stages or from an external source, the input unit being adapted to control voltages of a first node and a second node;
a first output unit adapted to generate an emission control signal based on the voltages of the first node and the second node; and
a second output unit adapted to generate an inverted emission control signal based on the voltages of the first node and the second node.

17. A method for adjusting a width of an emission control signal, comprising:
supplying a first clock signal to even-numbered stages of an emission control line driver, the even-numbered stages being connected to even-numbered emission control lines of a panel, respectively,
supplying a second clock signal to odd-numbered stages of the emission control line driver, the odd-numbered stages being connected to odd-numbered emission control lines, respectively,
wherein each of the even and the odd numbered stages includes an input unit, a first output unit and a second output unit, and driving each of the even and odd numbered stages includes:
supplying a control signal and an inverted control signal output from a previous one of the even and the odd numbered stages or from an external source to the input unit, the input unit being adapted to control voltages of a first node and a second node;
generating and outputting from the first output unit an emission control signal based on the voltages of the first node and the second node and output; and
generating and outputting from the second output unit an inverted emission control signal based on the voltages of the first node and the second node.

18. The method as claimed in claim 17, wherein for each of the odd and the even numbered stages, generating the emission control signal and the inverted emission control signal includes setting a width of the generated emission control signal and a width of the inverted emission control signal to correspond to a number of horizontal periods during which the control signal is supplied thereto.

19. The method as claimed in claim 17, wherein driving each of the even and odd numbered stages includes:
supplying a start signal as the control signal and an inverted start signal as the inverted control signal to a first one of the even and the odd numbered stages; and
sequentially supplying the respectively generated inverted emission control signal and the respectively generated emission control signal to a subsequent one of the remaining even and the odd numbered stages to be driven as the control signal and the inverted control signal, respectively.

* * * * *